United States Patent
Nam et al.

(10) Patent No.: US 10,078,976 B2
(45) Date of Patent: Sep. 18, 2018

(54) DISPLAY DEVICE

(71) Applicant: Samsung Display Co., Ltd., Yongin-si, Gyeonggi-do (KR)

(72) Inventors: Wi Jin Nam, Busan (KR); Hyeon Jin Kim, Tongyeong-si (KR); Soon Nyung Park, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/398,162

(22) Filed: Jan. 4, 2017

(65) Prior Publication Data
US 2017/0270842 A1    Sep. 21, 2017

(30) Foreign Application Priority Data
Mar. 15, 2016 (KR) .......................... 10-2016-0030903

(51) Int. Cl.
*H01L 27/12* (2006.01)
*G09G 3/00* (2006.01)
(Continued)

(52) U.S. Cl.
CPC .............. *G09G 3/006* (2013.01); *H01L 22/32* (2013.01); *H01L 27/124* (2013.01);
(Continued)

(58) Field of Classification Search
CPC ............... H01L 27/124; H01L 27/1244; H01L 27/3223; H01L 22/32; G09G 3/006; G09G 2300/0413
See application file for complete search history.

(56) References Cited

U.S. PATENT DOCUMENTS

| 2014/0176844 A1* | 6/2014 | Yanagisawa | .......... G02F 1/1309 349/43 |
| 2016/0232826 A1* | 8/2016 | Cho | ........................ G09G 3/006 |
| 2016/0293884 A1* | 10/2016 | Zhang | ................ H05B 33/0896 |

FOREIGN PATENT DOCUMENTS

| KR | 10-2010-0078299 | 7/2010 |
| KR | 10-2014-0086639 | 7/2014 |

(Continued)

*Primary Examiner* — Phat X Cao
(74) *Attorney, Agent, or Firm* — Lewis Roca Rothgerber Christie LLP

(57) ABSTRACT

An exemplary embodiment of the present disclosure provides a display device including: a substrate including a display area and a non-display area; a COF package overlapped with the non-display area of the substrate; a printed circuit board (PCB) overlapped with the COF package; a plurality of pixels disposed on the display area of the substrate; a plurality of data lines connected to the plurality of pixels; a first crack sensing line disposed on the non-display area of the substrate; a second crack sensing line that extends to be parallel to the first crack sensing line on the non-display area of the substrate and is connected to the first data line of the plurality of data lines; a first dummy wire that is disposed on the COF package and is overlapped with the first crack sensing line and the second crack sensing line; a first anisotropic conductive film disposed between the substrate and the COF package; a first test pattern and a second test pattern disposed on the PCB; a third test pattern that is disposed on the COF package and is overlapped with the first test pattern and the second test pattern; and a second anisotropic conductive film disposed between the COF package and the PCB.

20 Claims, 9 Drawing Sheets

(51) Int. Cl.
 *H01L 27/32* (2006.01)
 *H01L 21/66* (2006.01)
(52) U.S. Cl.
 CPC . *H01L 27/3223* (2013.01); *G09G 2300/0413* (2013.01); *G09G 2330/12* (2013.01)

(56) References Cited

FOREIGN PATENT DOCUMENTS

KR 10-2014-0128733 11/2014
KR 10-2014-0145444 12/2014

\* cited by examiner

DISPLAY DEVICE

CROSS-REFERENCE TO RELATED APPLICATION

This application claims priority to and the benefit of Korean Patent Application No. 10-2016-0030903, filed in the Korean Intellectual Property Office on Mar. 15, 2016, the entire content of which is incorporated herein by reference.

BACKGROUND

1. Field

The present disclosure relates to display devices.

2. Description of the Related Art

A portable electronic device (such as a mobile phone, a navigation device, a digital camera, an electronic book, a portable game machine, or various kinds of terminals) uses a liquid crystal display (LCD) or an organic light emitting diode (OLED) display. A display device used in the portable electronic device has been developed to have a flexible form in order to improve portability of the display device.

A flexible display device may be achieved by manufacturing a flat type of display device (a flat display device) and then bending it. In this case, while the flat panel display is being bent, a substrate thereof may be cracked. When a small size of crack (small size crack) occurs in the substrate, it may not be well detected early and may not greatly affect operation of the display device. The small size of crack may increase as time goes on, thus moisture may be permeated inside the display device through a portion where the crack occurs. When the moisture is permeated inside the display device, reliability thereof may decrease to affect operation of the display device.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide a display device that is capable of sensing whether a crack occurs in the display device.

An exemplary embodiment provides a display device including: a substrate including a display area and a non-display area; a COF package overlapped with the non-display area of the substrate; a printed circuit board (PCB) overlapped with the COF package; a plurality of pixels disposed on the display area of the substrate; a plurality of data lines connected to the plurality of pixels; a first crack sensing line disposed on the non-display area of the substrate; a second crack sensing line that extending in parallel with the first crack sensing line on the non-display area of the substrate and is connected to the first data line of the plurality of data lines; a first dummy wire that is disposed on the COF package and is overlapped with the first crack sensing line and the second crack sensing line; a first anisotropic conductive film disposed between the substrate and the COF package; a first test pattern and a second test pattern disposed on the PCB; a third test pattern that is disposed on the COF package and is overlapped with the first test pattern and the second test pattern; and a second anisotropic conductive film disposed between the COF package and the PCB.

The first test pattern, the second test pattern, and the third test pattern may be disposed at a center of an overlapped portion of the COF package and the PCB, in a plan view.

The first test pattern and the third test pattern may be configured to be connected by and the second test pattern and the third test pattern may be configured to be connected by the second anisotropic conductive film.

The first crack sensing line and the first dummy wire may be configured to be connected by and the second crack sensing line and the first dummy wire may be configured to be connected by the first anisotropic conductive film.

The display device may further include: a first test gate line and a first test signal line disposed in the non-display area of the substrate; and a first switching element connected to the first test gate line, the first test signal line, and the plurality of data lines.

The display device may further include: a second test gate line and a second test signal line disposed in the non-display area of the substrate; and a second switching element connected to the second test gate line, the second test signal line, and the plurality of data lines.

A first end portion of the first crack sensing line may be connected to the second test signal line, and a second end portion of the first crack sensing line may be overlapped with the first dummy wire.

A first end portion of the second crack sensing line may be connected to the first data line through the second switching element, and a second end portion of the second crack sensing line may be overlapped with the first dummy wire.

When a gate-on voltage is applied to the first test gate line, the plurality of data lines may receive a first voltage from the first test signal line, and when a gate-on voltage is applied to the second test gate line, the plurality of data lines may receive a second voltage from the second test signal line.

After the gate-on voltage is applied to the first test gate line during a first time, the gate-on voltage may be applied to the second test gate line during a second time.

The first voltage and the second voltage may be different.

The first voltage may be a voltage for displaying a highest gray, and the second may be a voltage for displaying a lowest gray.

The first crack sensing line and the second crack sensing line may be disposed at an upper edge, a left edge, and a lower edge of the substrate.

The display device may further include: a third crack sensing line disposed on the non-display area of the substrate; a fourth crack sensing line that extends to be parallel to the third crack sensing line on the non-display area of the substrate and is connected to the second data line of the plurality of data lines; and a second dummy wire that is disposed on the COF package and is overlapped with the third crack sensing line and the fourth crack sensing line.

The third crack sensing line and the fourth crack sensing line may be disposed at the upper edge, a right edge, and the lower edge of the substrate.

The third crack sensing line and the second dummy wire may be connected and the fourth crack sensing line and the second dummy wire may be connected by the first anisotropic conductive film.

The display device may further: include a first test gate line and a first test signal line disposed in the non-display area of the substrate; and a first switching element connected to the first test gate line, the first test signal line, and the plurality of data lines.

The display device may further include: a second test gate line and a second test signal line disposed in the non-display area of the substrate; and a second switching element connected to the second test gate line, the second test signal line, and the plurality of data lines.

A first end portion of the third crack sensing line may be connected to the second test signal line, and a second end portion of the third crack sensing line may be overlapped with the first dummy wire.

A first end portion of the fourth crack sensing line may be connected to the first data line through the second switching element, and a second end portion of the fourth crack sensing line may be overlapped with the first dummy wire.

According to the embodiment, it is possible to prevent a defect of a display device due to a crack by sensing whether the crack occurs in the display device.

DETAILED DESCRIPTION

Figure 1:
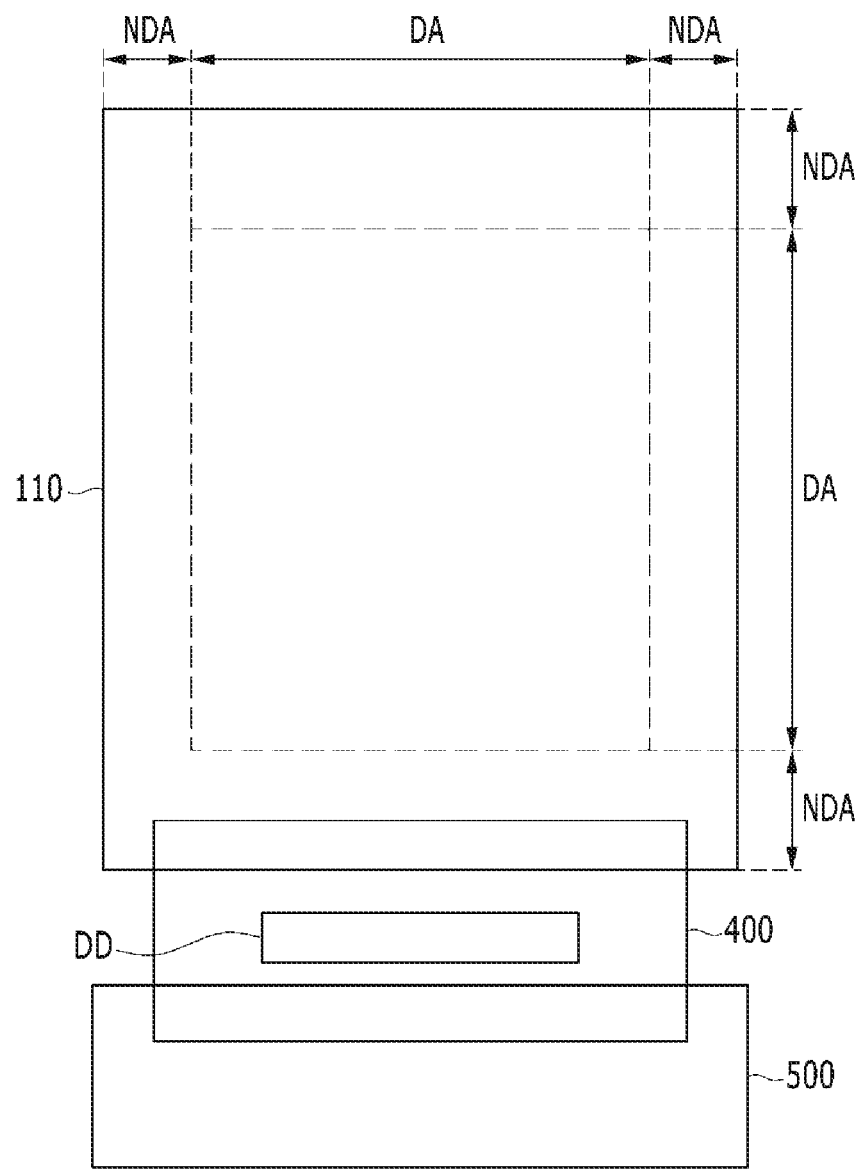
FIG. 1 illustrates a top plan view of a display device according to an exemplary embodiment.

Hereinafter, example embodiments will be described in more detail with reference to the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the disclosure to those skilled in the art. Accordingly, processes, elements, and techniques that are not necessary to those having ordinary skill in the art for a complete understanding of the aspects and features of the disclosure may not be described. Unless otherwise noted, like reference numerals denote like elements throughout the attached drawings and the written description, and thus, descriptions thereof may not be repeated.

Further, in the drawings, the size and thickness of each element are arbitrarily illustrated for ease of description, and the present disclosure is not necessarily limited to those illustrated in the drawings. In the drawings, the thickness of layers, films, panels, regions, etc., are exaggerated for clarity. In the drawings, for ease of description, the thicknesses of some layers and regions are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" refers to positions on or below the object portion, and does not necessarily refer to positions on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "on a plane" refers to viewing a target portion from the top, and the phrase "on a cross-section" refers to viewing a cross-section formed by vertically cutting a target portion from the side.

A display device according to an exemplary embodiment will now be described with reference to FIG. 1.

FIG. 1 illustrates a top plan view of a display device according to an exemplary embodiment.

As shown in FIG. 1, a display device according to an exemplary embodiment includes a substrate 110.

The substrate 110 may be made of an insulating material such as glass, polymer, and/or stainless steel. The substrate 110 may be flexible, stretchable, foldable, bendable, and/or rollable. Since the substrate 110 is flexible, stretchable, foldable, bendable, and/or rollable, the entire display device may be flexible, stretchable, foldable, bendable, and/or rollable. For example, the substrate 110 may include a flexible film made of a resin such as polyimide, etc.

The substrate 110 includes a display area (DA) for displaying an image and a non-display area (NDA) in which a driver for transmitting a signal for driving the display area (DA) is disposed (arranged). The non-display area (NDA) is disposed at an edge of the display area (DA). In FIG. 1, it is illustrated that the non-display area (NDA) surrounds the display area (DA), but the present disclosure is not limited thereto. The non-display area (NDA) may be respectively disposed at opposite edges of the display area (DA), and the non-display area (NDA) may be respectively disposed at a left edge and a lower edge of the display area (DA).

A plurality of pixels are disposed (arranged) on the display area (DA) of the substrate 110. One pixel is a minimum unit for displaying an image.

A chip-on-film ("COF") package 400 is attached to one edge of the substrate 110. In FIG. 1, it is illustrated that the COF package 400 is attached to the lower edge of the substrate 110, but the present disclosure is not limited thereto, and the COF package 400 may be attached to another edge thereof. The COF package 400 is overlapped with the non-display area (NDA) of the substrate 110.

A data driver (DD) is disposed in the COF package 400. The data driver (DD) may transmit a data signal to the display area (DA) of the substrate 110 to drive a plurality of pixels.

The one edge of the COF package 400 is attached to the substrate 110, and the other edge thereof is attached to the PCB 500. In FIG. 1, it is illustrated that the COF package 400 is attached to an upper edge of the PCB 500, but the present disclosure is not limited thereto, and the COF package 400 may be attached to another edge thereof. The COF package 400 is overlapped with the PCB 500.

The PCB 500 generates various signals for driving the plurality of pixels to transmit them to the display area (DA) of the substrate 110. For example, a timing controller may be disposed on the PCB 500, and the timing controller generates the driving signals for driving the plurality of pixels.

Hereinafter, the substrate and the COF package of the display device according to the exemplary embodiment and a connection relationship therebetween will be described with reference to FIG. 2 to FIG. 5.

Figure 2:
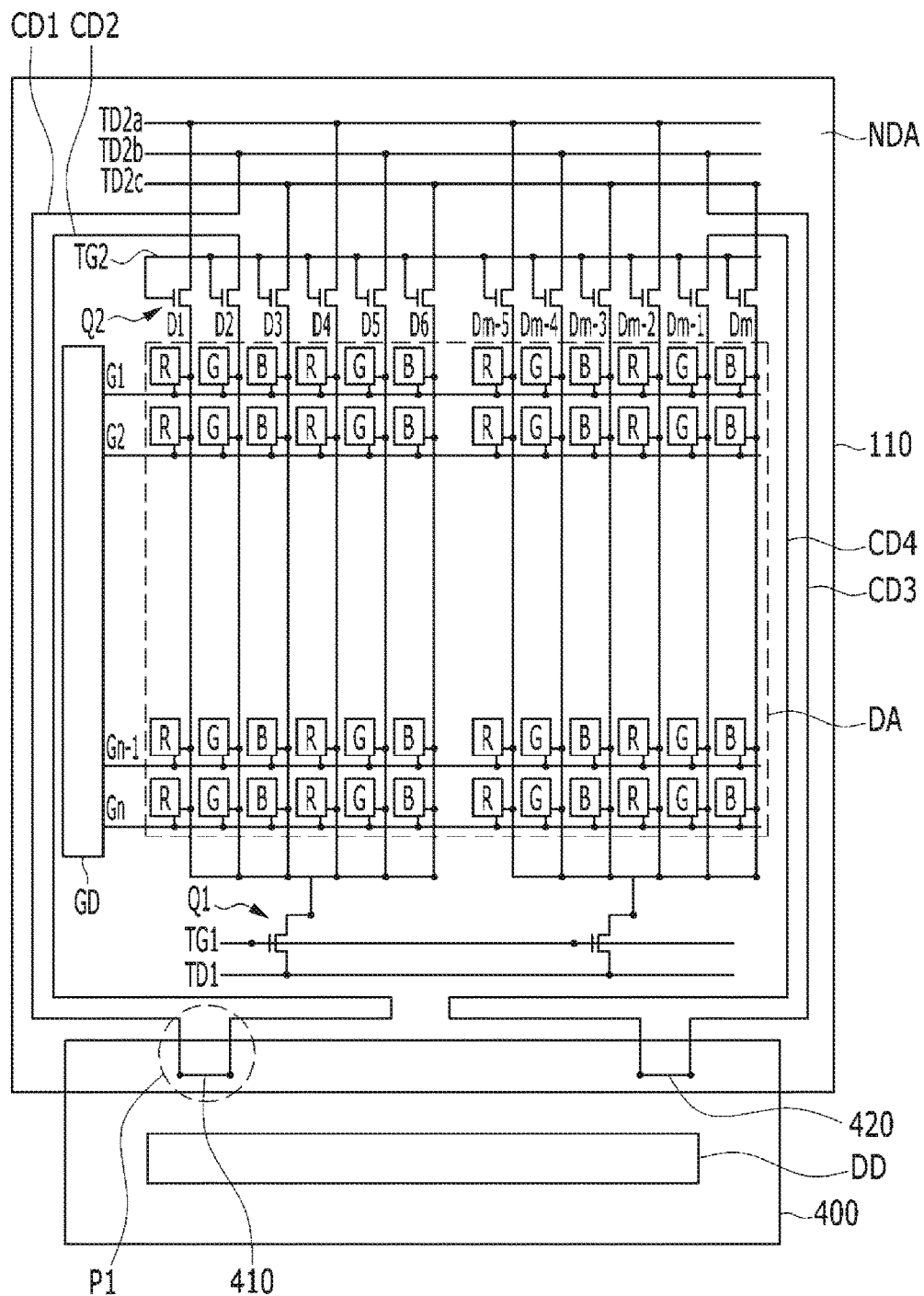
FIG. 2 illustrates a top plan view of a substrate and a chip-on-film (COF) package of a display device according to an exemplary embodiment.
Figure 3:
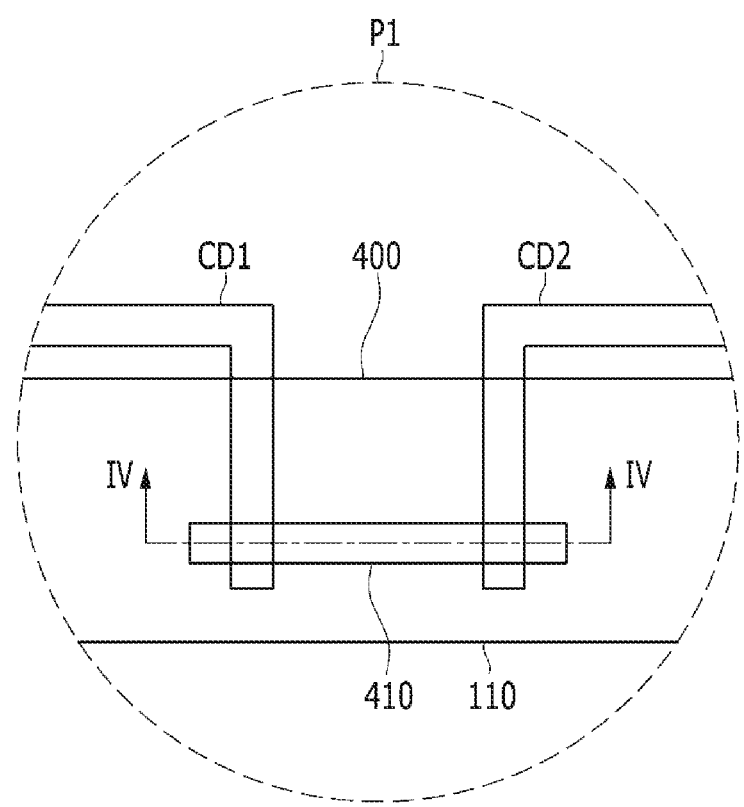
FIG. 3 illustrates an enlarged top plan view of portion P1 of FIG. 2.
Figure 4:
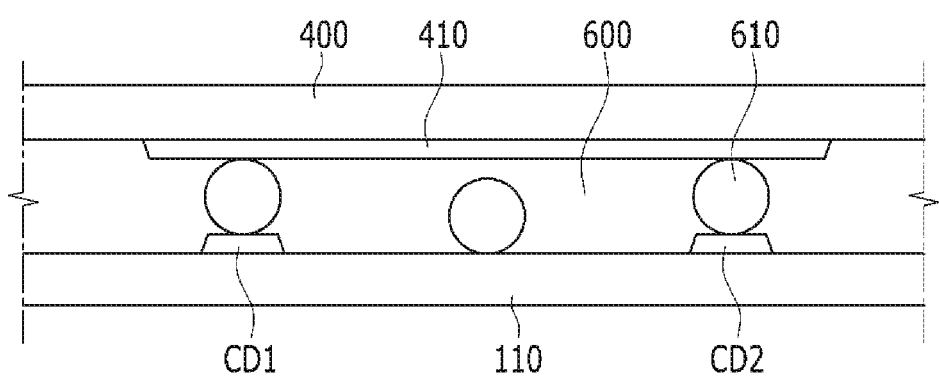
FIG. 4 illustrates a cross-sectional view taken along line IV-IV of FIG. 3.
Figure 5:
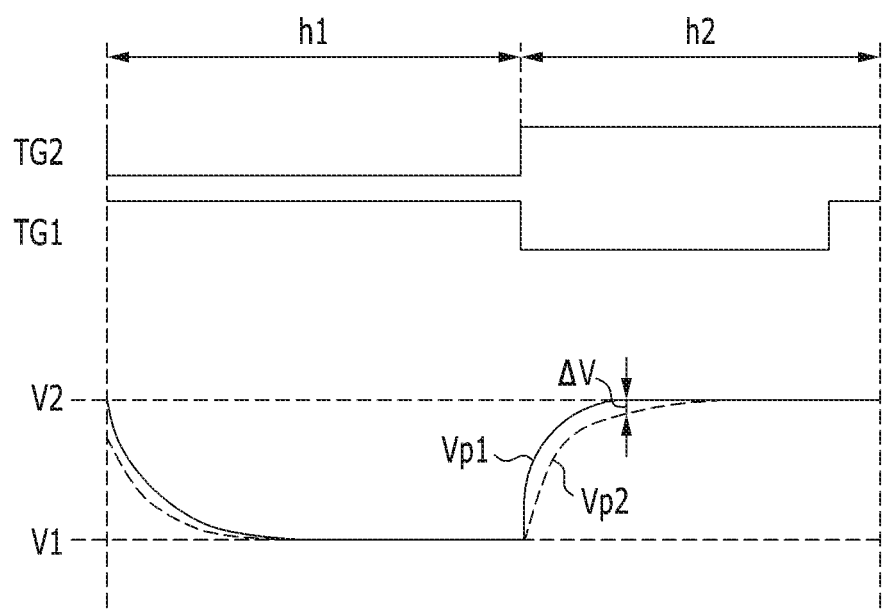
FIG. 5 illustrates a waveform diagram of a signal applied to a display device according to an exemplary embodiment.

FIG. 2 illustrates a top plan view of a substrate and a COF package of a display device according to an exemplary embodiment, and FIG. 3 illustrates an enlarged top plan view of portion P1 of FIG. 2. FIG. 4 illustrates a cross-sectional view taken along line IV-IV of FIG. 3, and FIG. 5 illustrates a waveform diagram of a signal applied to a display device according to an exemplary embodiment.

The display device according to an exemplary embodiment includes a plurality of pixels (R, G, and B) disposed on the substrate 110, and gate lines (G1, G2, . . . , Gn-1, and Gn) and data lines (D1, D2, D3, D4, D5, D6, . . . , Dm-5, Dm-4, Dm-3, Dm-2, Dm-1, and Dm) connected to the plurality of pixels (R, G, and B).

The plurality of pixels (R, G, and B) are disposed in the display area (DA) of the substrate 110, and are disposed to have a matrix form along a row direction and a column direction.

The gate lines (G1, G2, . . . , Gn-1, and Gn) extend along a row direction while being spaced apart from each other by a set or predetermined distance. The plurality of pixels (R, G, and B) adjacent to each other in the row direction are connected to the same gate line (G1, G2, . . . , Gn-1, and Gn).

A gate driver (GD) connected to the gate lines (G1, G2, . . . , Gn-1, and Gn) is disposed on the non-display area (NDA) of the substrate 110. The gate driver (GD) transmits a gate signal including a gate-on voltage and a gate-off voltage to the respective gate lines (G1, G2, . . . , Gn-1, and Gn).

The data lines (D1, D2, D3, D4, D5, D6, . . . , Dm-5, Dm-4, Dm-3, Dm-2, Dm-1, and Dm) extend along a column direction while being spaced apart from each other by a set or predetermined distance. In one embodiment, the data lines (D1, D2, D3, D4, D5, D6, . . . , Dm-5, Dm-4, Dm-3, Dm-2, Dm-1, and Dm) are connected to the data driver (DD). The data driver (DD) transmits a data signal to the respective data lines (D1, D2, D3, D4, D5, D6, . . . , Dm-5, Dm-4, Dm-3, Dm-2, Dm-1, and Dm). The plurality of pixels (R, G, and B) adjacent to each other in the column direction are connected to the same data lines (D1, D2, D3, D4, D5, D6, . . . , Dm-5, Dm-4, Dm-3, Dm-2, Dm-1, and Dm). The data lines (D1, D2, D3, D4, D5, D6, . . . , Dm-5, Dm-4, Dm-3, Dm-2, Dm-1, and Dm) may transmit a data signal to the respective pixels to display set or predetermined luminance.

In one embodiment, each of the pixels (R, G, and B) is connected to the respective gate lines (G1, G2, . . . , Gn-1, and Gn) and the respective data lines (D1, D2, D3, D4, D5, D6, . . . , Dm-5, Dm-4, Dm-3, Dm-2, Dm-1, and Dm) through a thin film transistor. When a gate-on voltage is applied to the gate lines (G1, G2, . . . , Gn-1, and Gn), the thin film transistor is turned on, thus a data signal is applied to each pixel through the data lines (D1, D2, D3, D4, D5, D6, . . . , Dm-5, Dm-4, Dm-3, Dm-2, Dm-1, and Dm).

A first test gate line TG1, a second test gate line TG2, a first test signal line TD1, and a plurality of second test signal lines (TD2a, TD2b, and TD2c) are disposed (arranged) in the non-display area (NDA) of the substrate 110.

The first test gate line TG1 and the first test signal line TD1 may be disposed to be parallel to each other along the row direction. In FIG. 2, it is illustrated that the first test gate line TG1 and the first test signal line TD1 are disposed at the lower edge of the substrate 110, but the present disclosure is not limited thereto, and the first test gate line TG1 and the first test signal line TD1 may be disposed at various suitable positions.

The second test gate line TG2 and the second test signal lines (TD2a, TD2b, and TD2c) may be disposed to be parallel to each other along the row direction. In FIG. 2, it is illustrated that the second test gate line TG2 and the second test signal lines (TD2a, TD2b, and TD2c) are disposed at the upper edge of the substrate 110, but the present disclosure is not limited thereto, and the second test gate line TG2 and the second test signal lines (TD2a, TD2b, and TD2c) may be disposed at various suitable positions.

In addition, a first switching element Q1 connected to the first test gate line TG1, the first test signal line TD1, and the data lines (D1, D2, D3, D4, D5, D6, . . . , Dm-5, Dm-4, Dm-3, Dm-2, Dm-1, and Dm) is disposed in the non-display area (NDA) of the substrate 110. The first switching element Q1 may include a plurality of switching elements. Each switching element in the first switching element Q1 may be connected to six of the plurality of data lines (D1, D2, D3, D4, D5, D6, . . . , Dm-5, Dm-4, Dm-3, Dm-2, Dm-1, and Dm).

A second switching element Q2 connected to the second test gate line TG2, the second test signal lines (TD2a, TD2b, and TD2c), and the data lines (D1, D2, D3, D4, D5, D6, . . . , Dm-5, Dm-4, Dm-3, Dm-2, Dm-1, and Dm) is disposed in the non-display area (NDA) of the substrate 110. Three of the second test signal lines (TD2a, TD2b, and TD2c) and the second switching element Q2 may be disposed on the substrate 110. The second switching element Q2 may include a plurality of switching elements. The number of the switching elements in the second switching element Q2 may correspond to the number of the data lines (D1, D2, D3, D4, D5, D6, . . . , Dm-5, Dm-4, Dm-3, Dm-2, Dm-1, and Dm). Each switching element in the second switching element Q2 is connected to one of the plurality of data lines (D1, D2, D3, D4, D5, D6, . . . , Dm-5, Dm-4, Dm-3, Dm-2, Dm-1, and Dm). Adjacent switching elements in the second switching elements Q2 may be connected to different second test signal lines (TD2a, TD2b, and TD2c).

A first crack sensing line CD1, a second crack sensing line CD2, a third crack sensing line CD3, and a fourth crack sensing line CD4 are disposed (arranged) in the non-display area (NDA) of the substrate 110. The first crack sensing line CD1, the second crack sensing line CD2, the third crack sensing line CD3, and the fourth crack sensing line CD4 may be disposed on the same layer as a metal layer disposed on the display area (DA) of the substrate 110. For example, the first crack sensing line CD1, the second crack sensing line CD2, the third crack sensing line CD3, and the fourth crack sensing line CD4 may disposed on the same layer as the gate lines (G1, G2, . . . , Gn-1, and Gn) or the data lines (D1, D2, D3, D4, D5, D6, . . . , Dm-5, Dm-4, Dm-3, Dm-2, Dm-1, and Dm).

The first crack sensing line CD1 and the second crack sensing line CD2 may be disposed to partially surround an upper side and a lower side of the plurality of pixels (R, G, and B) and to entirely surround a left side of the plurality of pixels (R, G, and B). That is, the first crack sensing line CD1 and the second crack sensing line CD2 may be disposed at the upper edge, the left edge, and the lower edge of the substrate 110. The first crack sensing line CD1 and the second crack sensing line CD2 may extend in parallel with each other.

A first end portion of the first crack sensing line CD1 may be connected to one of the second test signal lines (TD2a, TD2b, and TD2c). A second end portion of the first crack sensing line CD1 is overlapped with the COF package 400. A first end portion of the second crack sensing line CD2 is connected to one of the data lines (D1, D2, D3, D4, D5, D6, ..., Dm-5, Dm-4, Dm-3, Dm-2, Dm-1, and Dm) through the second switching element Q2. For example, the first end portion of the second crack sensing line CD2 may be connected to the data line D2 (hereinafter referred to as 'first data line') disposed at a second column from the left edge of the substrate 110. A second end portion of the second crack sensing line CD2 is overlapped with the COF package 400.

The third crack sensing line CD3 and the fourth crack sensing line CD4 may be disposed to partially surround the upper side and the lower side of the plurality of pixels (R, G, and B) and to entirely surround a right side of the plurality of pixels (R, G, and B). That is, a third crack sensing line CD3 and fourth crack sensing line CD4 may be disposed at the upper edge, the right edge, and the lower edge of the substrate 110. The third crack sensing line CD3 and the fourth crack sensing line CD4 may extend in parallel with each other.

A first end portion of the third crack sensing line CD3 is connected to one of the second test signal lines (TD2a, TD2b, and TD2c). A second end portion of the third crack sensing line CD3 is overlapped with the COF package 400. A first end portion of the fourth crack sensing line CD4 is connected to one of the data lines (D1, D2, D3, D4, D5, D6, ..., Dm-5, Dm-4, Dm-3, Dm-2, Dm-1, and Dm) through the second switching element Q2. For example, the first end portion of the fourth crack sensing line CD4 may be connected to the data line Dm-1 (hereinafter referred to as 'second data line') disposed at a second column from the right edge of the substrate 110. A second end portion of the fourth crack sensing line CD4 is overlapped with the COF package 400.

A first dummy wire 410 and a second dummy wire 420 are disposed on the COF package 400. The first dummy wire 410 and the second dummy wire 420 are disposed on the surface of the COF package 400 facing the substrate 110.

The first dummy wire 410 is overlapped with the first crack sensing line CD1 and the second crack sensing line CD2, and the first dummy wire 410 faces the first crack sensing line CD1 and the second crack sensing line CD2.

The second dummy wire 420 is overlapped with the third crack sensing line CD3 and the fourth crack sensing line CD4, and the second dummy wire 420 faces the third crack sensing line CD3 and the fourth crack sensing line CD4.

A first anisotropic conductive film 600 is disposed between the substrate 110 and the COF package 400 at a portion where the substrate 110 and the COF package 400 are overlapped with each other. The first anisotropic conductive film 600 may electrically and physically connect the substrate 110 and the COF package 400. An anisotropic conductive film (ACF) is an adhesive film for bonding circuits which allows electricity to pass through only in one direction and acts as an insulator in other directions. That is, the anisotropic conductive film is conductive in a thickness direction but not a width direction. The first anisotropic conductive film 600 includes a thermosetting adhesive and a plurality of first conductive particles 610 positioned therein. When a pressure is applied to the first anisotropic conductive film 600 in a high temperature state, a first conductive particle 610 contacts the substrate 110 and the COF package 400 so that the substrate 110 and the COF package 400 may be electrically connected. Further, when the adhesive is cured, the substrate 110 and the COF package 400 are physically connected.

As described above, the second end portion of the first crack sensing line CD1 and the second end portion of the second crack sensing line CD2 which are disposed on the substrate 110 are overlapped with the COF package 400. Particularly, the second end portion of the first crack sensing line CD1 and the second end portion of the second crack sensing line CD2 are overlapped with the first dummy wire 410 disposed on the COF package 400. Accordingly, the first crack sensing line CD1 and the first dummy wire 410 are connected by the first anisotropic conductive film 600, and the second crack sensing line CD2 and the first dummy wire 410 are connected by the first anisotropic conductive film 600. Accordingly, the first crack sensing line CD1 and the second crack sensing line CD2 are connected to each other through the first dummy wire 410.

The second end portion of the third crack sensing line CD3 and the second end portion of the fourth crack sensing line CD4 which are disposed on the substrate 110 are overlapped with the COF package 400. Particularly, the second end portion of the third crack sensing line CD3 and the second end portion of the fourth crack sensing line CD4 are overlapped with the second dummy wire 420 disposed on the COF package 400. Accordingly, the third crack sensing line CD3 and the second dummy wire 420 are connected by the first anisotropic conductive film 600, and the fourth crack sensing line CD4 and the second dummy wire 420 are connected by the first anisotropic conductive film 600. Accordingly, the third crack sensing line CD3 and the fourth crack sensing line CD4 are connected to each other through the second dummy wire 420.

Next, operation of the display device according to the exemplary embodiment will be described when a signal of FIG. 5 is applied thereto.

Referring to FIG. 5, when a gate-on signal is applied to the first test gate line TG1 during a first time h1, the first switching element Q1 is turned on. A first voltage V1 applied to the first test signal line TD1 is transmitted to the plurality of data lines (D1, D2, D3, D4, D5, D6, ..., Dm-5, Dm-4, Dm-3, Dm-2, Dm-1, and Dm) connected to the first switching element Q1 through the first switching element Q1. The first voltage V1 may be a voltage that allows the plurality of pixels (R, G, and B) to display a highest gray level. When the first voltage V1 is applied to the plurality of data lines (D1, D2, D3, D4, D5, D6, ..., Dm-5, Dm-4, Dm-3, Dm-2, Dm-1, and Dm), a voltage Vp1 of the plurality of pixels (R, G, and B) may become the first voltage V1 to display white.

After a gate-off signal is applied to the first test gate line TG1, when the gate-on signal is applied to the second test gate line TG2 during a second time h2, the second switching element Q2 is turned on. A second voltage V2 applied to the second test signal lines (TD2a, TD2b, and TD2c) is transmitted to the plurality of data lines (D1, D2, D3, D4, D5, D6, ..., Dm-5, Dm-4, Dm-3, Dm-2, Dm-1, and Dm). The second voltage V2 may be a voltage which allows the plurality of pixels (R, G, and B) to display a lowest gray level. When the second voltage V2 is applied to the plurality of data lines (D1, D2, D3, D4, D5, D6, ..., Dm-5, Dm-4, Dm-3, Dm-2, Dm-1, and Dm), the voltage Vp1 of the plurality of pixels (R, G, and B) may become the second voltage V2 to display black.

When a crack has been generated in the non-display area (NDA) of the substrate 110, at least one of the first crack sensing line CD1, the second crack sensing line CD2, the third crack sensing line CD3, and the fourth crack sensing line CD4 may be damaged.

The first crack sensing line CD1 is connected to the first data line D2 through the first dummy wire 410 and the second crack sensing line CD2. The second crack sensing line CD2 is connected to the first data line D2. If a crack occurs in the non-display area (NDA) of the substrate 110, the first crack sensing line CD1 or the second crack sensing line CD2 may be damaged, and resistance of the first data line D2 may increase. If the substrate 110 and the COF package 400 are not properly compressed, a connection state between the first crack sensing line CD1 and the first dummy wire 410 or a connection state between the second crack sensing line CD2 and the first dummy wire 410 may be damaged, and resistance of the first data line D2 may increase. Accordingly, a voltage Vp2 of the pixel (G) connected to the first data line D2 does not reach the second voltage V2, and there is a difference voltage (ΔV) between the voltage Vp2 of the pixel (G) and the second voltage V2. Due to the difference voltage (ΔV), the pixel (G) connected to the first data line D2 does not display a lowest gray level, and it displays a higher gray level than the lowest gray level. Accordingly, when a crack occurs in the non-display area (NDA) of the substrate 110 or the substrate 110 and the COF package 400 is not properly compressed, a bright line may be viewed along the first data line D2. That is, through determining whether the bright line is viewed along the first data line D2, it may be sensed that a crack occurs in the non-display area (NDA) of the substrate 110 or the substrate 110 and the COF package 400 are badly compressed.

The third crack sensing line CD3 is connected to the second data line Dm-1 through the second dummy wire 420 and the fourth crack sensing line CD4. The fourth crack sensing line CD4 is connected to the second data line Dm-1. When a crack occurs in the non-display area (NDA) of the substrate 110, the third crack sensing line CD3 or the fourth crack sensing line CD4 may be damaged, and resistance of the second data line Dm-1 may increase. When the substrate 110 and the COF package 400 are not properly compressed, a connection state between the third crack sensing line CD3 and the second dummy wire 420 or a connection state between the fourth crack sensing line CD4 and the second dummy wire 420 may be damaged, and resistance of the second data line Dm-1 may increase. Accordingly, a voltage Vp2 of the pixel (G) connected to the second data line Dm-1 does not reach the second voltage V2, and there is a difference voltage (ΔV) between the voltage Vp2 of the pixel (G) and the second voltage V2. Due to the difference voltage (ΔV), the pixel (G) connected to the second data line Dm-1 does not display a lowest gray level, and it displays a gray level higher than the lowest gray level. Accordingly, when a crack occurs in the non-display area (NDA) of the substrate 110 or the substrate 110 and the COF package 400 are not properly compressed, a bright line may be viewed along the second data line Dm-1. That is, through determining whether the bright line is viewed along the second data line Dm-1, it may be sensed that a crack occurs in the non-display area (NDA) of the substrate 110 or the substrate 110 and the COF package 400 are badly compressed.

Hereinafter, the COF package and the PCB of the display device according to an exemplary embodiment and a connection portion therebetween will be described with reference to FIG. 6 to FIG. 8.

Figure 6:
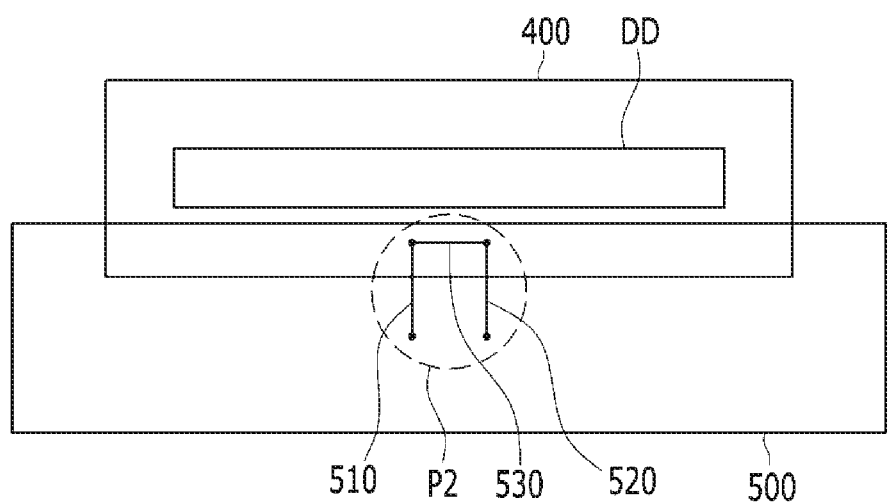
FIG. 6 illustrates a top plan view of a COF package and a printed circuit board (PCB) of a display device according to an exemplary embodiment.
Figure 7:
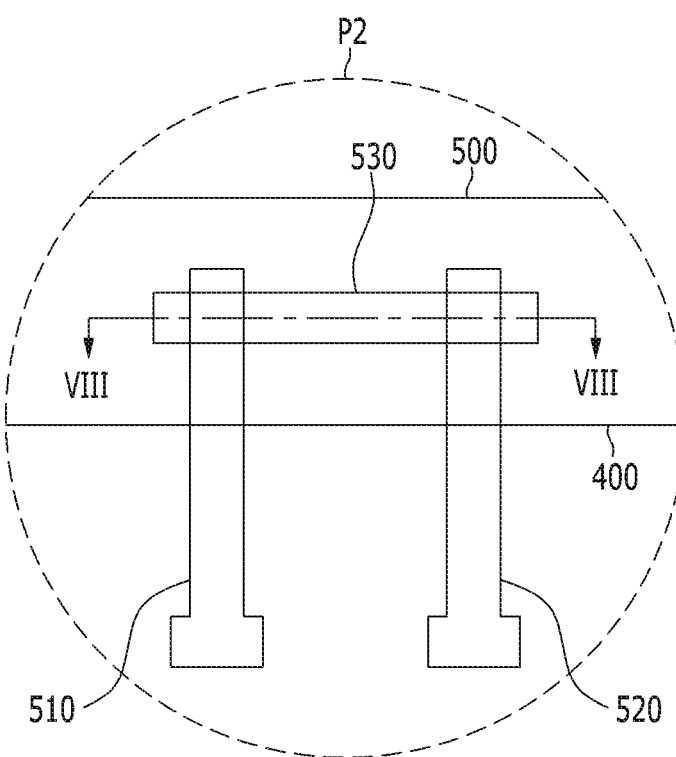
FIG. 7 illustrates an enlarged top plan view of portion P2 of FIG. 6.
Figure 8:
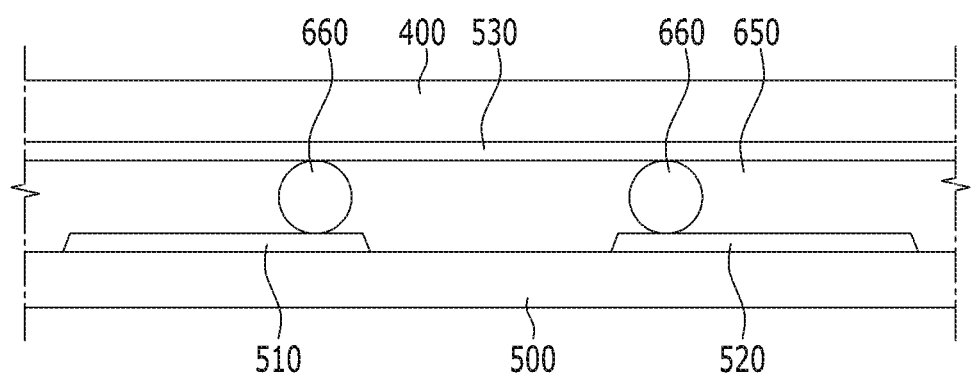
FIG. 8 illustrates a cross-sectional view taken along line VIII-VIII of FIG. 7.

FIG. 6 illustrates a top plan view of a COF package and a printed circuit board (PCB) of a display device according to an exemplary embodiment, FIG. 7 illustrates an enlarged top plan view of portion P2 of FIG. 6, and FIG. 8 illustrates a cross-sectional view taken along line VIII-VIII of FIG. 7.

A first test pattern 510 and a second test pattern 520 are disposed on the PCB 500. The first test pattern 510 and the second test pattern 520 are disposed on a surface of the PCB 500 facing the COF package 400.

The first test pattern 510 and the second test pattern 520 may extend to be parallel to each other. A least some of the first test pattern 510 and at least some of the second test pattern 520 are overlapped with the COF package 400.

A third test pattern 530 is disposed on the COF package 400. The third test pattern 530 is disposed on a surface of the COF package 400 facing the PCB 500.

The third test pattern 530 is overlapped with the first test pattern 510 and the second test pattern 520. The third test pattern 530 faces the first test pattern 510 and the second test pattern 520.

In a plan view, the first test pattern 510, the second test pattern 520, and the third test pattern 530 are disposed substantially at a center of the overlapped portion of the COF package 400 and the PCB 500.

A second anisotropic conductive film 650 is disposed between the COF package 400 and the PCB 500 at the portion at which the COF package 400 and the PCB 500 are overlapped. The second anisotropic conductive film 650 may electrically and physically connect the COF package 400 and the PCB 500. The second anisotropic conductive film 650 includes a thermosetting adhesive and a plurality of second conductive particles 660 disposed therein.

As described above, the first test pattern 510 and the second test pattern 520 disposed on the PCB 500 are overlapped with the third test pattern 530 disposed on the COF package 400. Accordingly, the first test pattern 510 and the third test pattern 530 are connected by the second anisotropic conductive film 650, and the second test pattern 520 and the third test pattern 530 are connected by the second anisotropic conductive film 650. Accordingly, the first test pattern 510 and the second test pattern 520 may be connected to each other through the third test pattern 530.

The first end portion of the first test pattern 510 and the first end portion of the second test pattern 520 may be overlapped with the third test pattern 530. The second end portion of the first test pattern 510 and the second end portion of the second test pattern 520 are not overlapped with the COF package 400, and they are exposed to the outside. Accordingly, the second end portion of the first test pattern 510 and the second end portion of the second test pattern 520 may contact a multimeter, and resistance of the first test pattern 510, the second test pattern 520, and the third test pattern 530 may be measured through the multimeter.

When the COF package 400 and the PCB 500 are not properly compressed, a connection state between the first test pattern 510 and the third test pattern 530 or a connection state between the second test pattern 520 and the third test pattern 530 may be damaged, and resistance of the first test pattern 510, the second test pattern 520, and the third test pattern 530 may increase. Accordingly, by measuring the resistance of the first test pattern 510, the second test pattern 520, and the third test pattern 530 and comparing the measured resistance with a reference resistance, the compression defect of the COF package 400 and the PCB 500 may be sensed.

Hereinafter, a display device according to a reference sample and the display device according to the exemplary embodiment will be compared and described with reference to FIG. 9.

Figure 9:
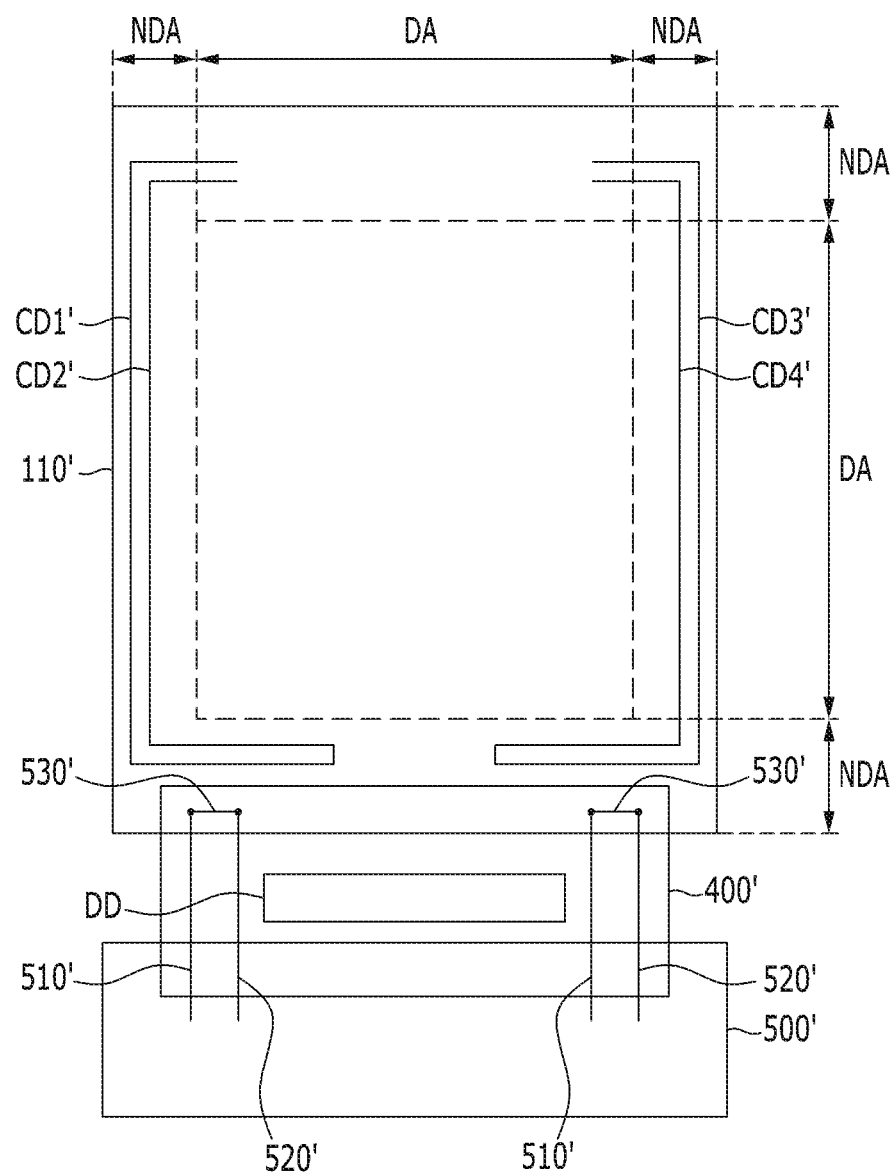
FIG. 9 illustrates a top plan view of a display device according to a reference sample.

FIG. 9 illustrates a top plan view of a display device according to a reference sample.

In the display device according to the reference sample, a first crack sensing line CD1', a second crack sensing line CD2', a third crack sensing line CD3', and a fourth crack sensing line CD4' are not overlapped with a COF package 400'. The first crack sensing line CD1' and the second crack sensing line CD2' are directly connected, and the third crack sensing line CD3' and the fourth crack sensing line CD4' are directly connected.

In a plan view, the first test pattern 510', the second test pattern 520', and the third test pattern 530' are disposed at opposite edges of the overlapped portion of the COF package 400' and the PCB 500'. That is, two first test patterns 510', two second test patterns 520', and two third test patterns 530' are respectively disposed. The first test pattern 510', the second test pattern 520', and the third test pattern 530' are formed to extend to the overlapped portion of the substrate 110' and the COF package 400'.

In the reference sample of FIG. 9, the crack of the substrate 110' may be sensed, but the compression defect of the substrate 110' and the COF package 400' may not be sensed, by using the first crack sensing line CD1', the second crack sensing line CD2', the third crack sensing line CD3', and the fourth crack sensing line CD4'. The compression defect of the substrate 110' and the COF package 400' may be sensed by using the first test pattern 510', the second test pattern 520', and the third test pattern 530'. In order to sense the compression defect, one contacts the multimeter to the first test pattern 510' and the second test pattern 520' to measure the resistance thereof. Accordingly, after a frame for protecting the display device is assembled, the compression defect may not be identified.

In the display device according to an exemplary embodiment, by using the first crack sensing line CD1, the second crack sensing line CD2, the third crack sensing line CD3, and the fourth crack sensing line CD4, the compression defect of the substrate 110 and the COF package 400 in addition to the crack of the substrate 110 may be sensed. After the frame is assembled, by applying a set or predetermined signal to each signal line, the crack of the substrate 110 and the compression defect of the substrate 110 and the COF package 400 may still be sensed.

In the reference sample of FIG. 9, since the first test pattern 510', the second test pattern 520', and the third test pattern 530' are disposed at the opposite edges of the overlapped portion of the COF package 400' and the PCB 500', when a compression defect occurs at a center of the overlapped portion of the COF package 400' and the PCB 500', the compression defect may not be sensed. In reality, the compression defect frequently occurs at the center of the overlapped portion of the COF package 400' and the PCB 500'.

In the exemplary embodiment, by disposing the first test pattern 510, the second test pattern 520, and the third test pattern 530 at the center of the overlapped portion of the COF package 400 and the PCB 500, a compression defect occurring at the center of the overlapped portion of the COF package 400 and the PCB 500 may be clearly sensed. In addition, by reducing the number of the first test pattern 510, the second test pattern 520, and the third test pattern 530, it is possible to reduce costs.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

| Description of symbols | |
|---|---|
| 110: substrate | 400: COF package |
| 410: first dummy wire | 420: second dummy wire |
| 500: printed circuit board (PCB) | 510: first test pattern |
| 520: second test pattern | 530: third test pattern |
| 600: first anisotropic conductive film | 650: second anisotropic conductive film |
| CD1: first crack sensing line | CD2: second crack sensing line |
| CD3: third crack sensing line | CD4: fourth crack sensing line |
| TD1: first test signal line | TD2a, TD2b, and TD2c: second test signal line |
| TG1: first test gate line | TG2: second test gate line |

What is claimed is:

1. A display device comprising:
a substrate including a display area and a non-display area;
a chip-on-film (COF) package overlapped with the non-display area of the substrate;
a printed circuit board (PCB) overlapped with the COF package;
a plurality of pixels on the display area of the substrate;
a plurality of data lines coupled to the plurality of pixels;
a first crack sensing line on the non-display area of the substrate;
a second crack sensing line extending in parallel with the first crack sensing line on the non-display area of the substrate and coupled to a first data line of the plurality of data lines;

a first dummy wire on the COF package and overlapped with the first crack sensing line and the second crack sensing line;
a first anisotropic conductive film between the substrate and the COF package;
a first test pattern and a second test pattern on the PCB;
a third test pattern on the COF package and overlapped with the first test pattern and the second test pattern; and
a second anisotropic conductive film between the COF package and the PCB.

2. The display device of claim 1, wherein
the first test pattern, the second test pattern, and the third test pattern are arranged at a center of an overlapped portion of the COF package and the PCB, in a plan view.

3. The display device of claim 2, wherein
the first test pattern and the third test pattern are configured to be connected by and the second test pattern and the third test pattern are configured to be connected by the second anisotropic conductive film.

4. The display device of claim 1, wherein
the first crack sensing line and the first dummy wire are configured to be connected by and the second crack sensing line and the first dummy wire are configured to be connected by the first anisotropic conductive film.

5. The display device of claim 4, further comprising:
a first test gate line and a first test signal line in the non-display area of the substrate; and
a first switching element coupled to the first test gate line, the first test signal line, and at least one of the plurality of data lines.

6. The display device of claim 5, further comprising:
a second test gate line and a second test signal line in the non-display area of the substrate; and
a second switching element coupled to the second test gate line, the second test signal line, and the first data line of the plurality of data lines.

7. The display device of claim 6, wherein
a first end portion of the first crack sensing line is coupled to the second test signal line, and a second end portion of the first crack sensing line is overlapped with the first dummy wire.

8. The display device of claim 7, wherein
a first end portion of the second crack sensing line is coupled to the first data line through the second switching element, and a second end portion of the second crack sensing line is overlapped with the first dummy wire.

9. The display device of claim 6, wherein
when a gate-on voltage is applied to the first test gate line, the plurality of data lines receive a first voltage from the first test signal line, and
when a gate-on voltage is applied to the second test gate line, the plurality of data lines receive a second voltage from the second test signal line.

10. The display device of claim 9, wherein
after the gate-on voltage is applied to the first test gate line during a first time, the gate-on voltage is applied to the second test gate line during a second time.

11. The display device of claim 10, wherein
the first voltage and the second voltage are different.

12. The display device of claim 11, wherein
the first voltage is a voltage for displaying a highest gray level, and the second is a voltage for displaying a lowest gray level.

13. The display device of claim 1, wherein
the first crack sensing line and the second crack sensing line are at an upper edge, a left edge, and a lower edge of the substrate.

14. The display device of claim 13, further comprising:
a third crack sensing line on the non-display area of the substrate;
a fourth crack sensing line extending in parallel with the third crack sensing line on the non-display area of the substrate and coupled to a second data line of the plurality of data lines; and
a second dummy wire on the COF package and overlapped with the third crack sensing line and the fourth crack sensing line.

15. The display device of claim 14, wherein
the third crack sensing line and the fourth crack sensing line are at the upper edge, a right edge, and the lower edge of the substrate.

16. The display device of claim 14, wherein
the third crack sensing line and the second dummy wire are configured to be connected by and the fourth crack sensing line and the second dummy wire are configured to be connected by the first anisotropic conductive film.

17. The display device of claim 16, further comprising:
a first test gate line and a first test signal line in the non-display area of the substrate; and
a first switching element coupled to the first test gate line, the first test signal line, and at least one of the plurality of data lines.

18. The display device of claim 17, further comprising:
a second test gate line and a second test signal line in the non-display area of the substrate; and
a second switching element coupled to the second test gate line, the second test signal line, and the first data line of the plurality of data lines.

19. The display device of claim 18, wherein
a first end portion of the third crack sensing line is coupled to the second test signal line, and a second end portion of the third crack sensing line is overlapped with the second dummy wire, and
a first end portion of the fourth crack sensing line is coupled to the second data line through the second switching element, and a second end portion of the fourth crack sensing line is overlapped with the second dummy wire.

20. A display device comprising:
a substrate including a display area and a non-display area;
a chip-on-film (COF) package overlapped with the non-display area of the substrate;
a plurality of pixels on the display area of the substrate;
a plurality of data lines coupled to the plurality of pixels;
a first crack sensing line on the non-display area of the substrate;
a second crack sensing line extending in parallel with the first crack sensing line on the non-display area of the substrate and coupled to a first data line of the plurality of data lines; and
a first dummy wire on the COF package and overlapped with the first crack sensing line and the second crack sensing line.

* * * * *